United States Patent
Wu et al.

(10) Patent No.: US 9,223,229 B2
(45) Date of Patent: Dec. 29, 2015

(54) EXPOSURE DEVICE AND EXPOSURE METHOD

(71) Applicant: Semiconductor Manufacturing International Corp., Shanghai (CN)

(72) Inventors: Qiang Wu, Shanghai (CN); Jing'an Hao, Shanghai (CN); Chang Liu, Shanghai (CN); Xin Yao, Shanghai (CN); Tianhui Li, Shanghai (CN); Qiang Shu, Shanghai (CN); Yiming Gu, Shanghai (CN)

(73) Assignee: SEMICONDUCTOR MANUFACTURING INTERNATIONAL CORP, Shanghai (CN)

( * ) Notice: Subject to any disclaimer, the term of this patent is extended or adjusted under 35 U.S.C. 154(b) by 455 days.

(21) Appl. No.: 13/761,436

(22) Filed: Feb. 7, 2013

(65) Prior Publication Data

US 2014/0063480 A1    Mar. 6, 2014

(30) Foreign Application Priority Data

Feb. 9, 2012 (CN) .......................... 2012 1 0028871

(51) Int. Cl.
*G03F 7/20* (2006.01)
*G03F 9/00* (2006.01)

(52) U.S. Cl.
CPC ........ *G03F 7/70725* (2013.01); *G03F 7/70716* (2013.01); *G03F 9/7003* (2013.01)

(58) Field of Classification Search
CPC ............ G03F 7/70775; G03F 7/70716; G03F 7/7085; G03F 9/7003; G03F 7/707; G03F 7/70725
USPC .......................................................... 355/72
See application file for complete search history.

(56) References Cited

U.S. PATENT DOCUMENTS

| | | | | | |
|---|---|---|---|---|---|
| 5,969,441 | A | * | 10/1999 | Loopstra et al. ............ 310/12.06 |
| 6,166,392 | A | * | 12/2000 | Chang .................. G03F 7/70358 250/548 |
| 6,327,022 | B1 | * | 12/2001 | Nishi ..................... G03F 7/2022 355/53 |
| 6,331,885 | B1 | * | 12/2001 | Nishi .................. G03F 7/70358 355/53 |
| 6,341,007 | B1 | * | 1/2002 | Nishi .................. G03F 7/70216 355/53 |
| 6,417,914 | B1 | * | 7/2002 | Li ............... 310/12.06 |
| 6,897,963 | B1 | * | 5/2005 | Taniguchi ........... G03F 7/70716 356/500 |
| 2001/0015795 | A1 | * | 8/2001 | Nishi .............................. 355/53 |
| 2001/0055117 | A1 | * | 12/2001 | Mizutani ....................... 356/401 |
| 2002/0015140 | A1 | * | 2/2002 | Yoda ..................... G03B 27/426 355/53 |
| 2002/0063856 | A1 | * | 5/2002 | Inoue .................. G03F 7/70691 355/53 |
| 2002/0082801 | A1 | * | 6/2002 | Shiraishi ............... G03F 9/7023 702/155 |

(Continued)

*Primary Examiner* — Steven H Whitesell Gordon
(74) *Attorney, Agent, or Firm* — Anova Law Group, PLLC

(57) ABSTRACT

An exposure method and an exposure device are provided. An exemplary exposure device includes a stage, a first clamp holder, a second clamp holder, an optical projection unit, a first alignment detection unit, and/or a second alignment detection unit. The stage includes a first region and a second region. The first clamp holder is located in the first region and adapted for holding a first substrate, and the second clamp holder is located in the second region and adapted for holding a second substrate. The optical projection unit is located above the stage and adapted for exposure of the first substrate or the second substrate. The first alignment detection unit is adapted for detecting alignment marks of the first substrate. The second alignment detection unit is adapted for detecting alignment marks of the second substrate. The exposure device can accurately position the stage and improve production yield.

18 Claims, 13 Drawing Sheets

(56) References Cited

U.S. PATENT DOCUMENTS

| | | | |
|---|---|---|---|
| 2003/0211410 A1* | 11/2003 | Irie | 430/22 |
| 2004/0227925 A1* | 11/2004 | Sato | 355/72 |
| 2005/0139790 A1 | 6/2005 | Boogaarts et al. | |
| 2005/0264777 A1* | 12/2005 | Gardner et al. | 355/53 |

* cited by examiner

EXPOSURE DEVICE AND EXPOSURE METHOD

CROSS REFERENCE TO RELATED APPLICATIONS

The present application claims priority to Chinese Patent Application No. 201210028871.5, filed on Feb. 9, 2012, and entitled "Exposure Device and Exposure Method", the entire disclosure of which is incorporated herein by reference.

FIELD OF THE DISCLOSURE

The present disclosure generally relates to the semiconductor manufacturing field and, more particularly, to an exposure device and an exposure method.

BACKGROUND OF THE DISCLOSURE

Lithography is considered as a key technique in semiconductor manufacturing processes, e.g., in manufacturing large scale integrated circuits (LSI). Lithography often includes a process for transferring patterns from a mask to a substrate by an exposure process. During semiconductor manufacturing processes, a series of complex and time-consuming lithography processes are performed mainly by corresponding exposure devices. Development of lithography technology or exposure devices has been made around three main factors including line widths, overlay accuracy, and production yields.

The exposure process often includes three steps: loading a substrate on a stage; aligning the substrate on the stage; and transferring a pattern from a mask to the substrate. The three steps are performed successively and repeatedly on the same stage. Because lithography is a key process in semiconductor manufacturing processes, it is important to improve production yields of the exposure devices in mass production. Conventional methods for improving production yields of the exposure devices include use of twin stages in exposure devices to simultaneously perform the above-described steps of loading, aligning, and transferring in the exposure process.

However, it is difficult to accurately control and match positions of the twin stages in conventional exposure devices. In addition, conventional calibration processes are complex, which may affect accuracy (e.g., overlay accuracy) of the exposure devices and generate inconveniences in use.

Therefore, there is a need to provide an exposure device that has improved accuracy and is convenient in use, and also to provide an exposure method.

SUMMARY

The present disclosure provides an exposure device and an exposure method using an accurately positioned stage to provide the exposure device with improved accuracy and conveniences in use.

According to various embodiments, there is provided an exposure device. The exposure device includes a stage, an optical projection unit, a first alignment detection unit, and a second alignment detection unit. The stage includes a first region and a second region related to the first region. The first clamp holder is located in the first region and adapted for holding a first substrate, and the second clamp holder is located in the second region and adapted for holding a second substrate. The optical projection unit is located above the stage and adapted for exposure of the first substrate or the second substrate. The first alignment detection unit is adapted for detecting alignment marks of the first substrate. The second alignment detection unit is adapted for detecting alignment marks of the second substrate. The first alignment detection unit and the second alignment detection unit are symmetrically positioned on opposite sides of the optical projection unit.

According to various embodiments, there is also provided an exposure method using the exposure device. Accordingly, the first substrate held by the first clamp holder is exposed by the optical projection unit. The alignment marks of the second substrate on the second clamp holder are detected by the second alignment detection unit. The second substrate held by the second clamp holder is exposed by the optical projection unit. Alignment marks of a third substrate on the first clamp holder are detected by the first alignment detection unit.

As disclosed herein, clamp holders are configured on a stage. When a first substrate in a first clamp holder is exposed by an optical projection unit, the alignment mark of a second substrate is detected by a first or second alignment detection unit to align the second substrate. This improves production yield of the exposure device.

Further, the exposure device employs one stage and one measurement unit in which two optical interferometers (e.g., with one along x-axis direction and the other along y-axis direction), or three optical interferometers (e.g., with one along x-axis direction, one along y-axis direction, and one along z-axis direction) are involved. There is no need to employ two stages, two measurement units for the two stages, four optical interferometers (e.g., with two along x-axis direction and two along y-axis direction), or six optical interferometers (e.g., with two along x-axis direction, two along y-axis direction, and two along z-axis direction) as in conventional twin-stage exposure devices. The disclosed exposure device including, e.g., one stage and one measurement unit, avoids complex calibration and interferences among the interferometers. The stage can be more accurately positioned.

In addition, when the first substrate held by the first clamp holder is exposed by the optical projection unit, the second alignment detection unit detects an alignment mark of the second substrate held by the second clamp holder. When the second substrate held by the second clamp holder is exposed by the optical projection unit, the first alignment detection unit detects an alignment mark of the third substrate held by the first clamp holder. This can improve production yield of the exposure device.

Other aspects or embodiments of the present disclosure can be understood by those skilled in the art in light of the description, the claims, and the drawings of the present disclosure.

DETAILED DESCRIPTION OF THE DISCLOSURE

Figure 1:
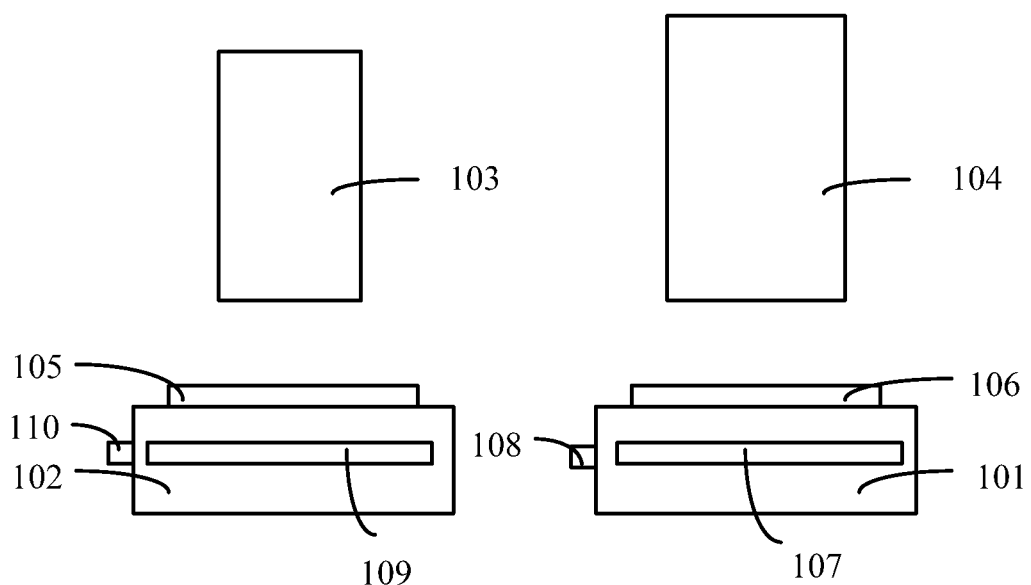
FIG. 1 is a schematic structural view of a conventional twin-stage exposure device.

Reference will now be made in detail to exemplary embodiments of the disclosure, which are illustrated in the accompanying drawings. Wherever possible, the same reference numbers will be used throughout the drawings to refer to the same or like parts. For illustration purposes, elements illustrated in the accompanying drawings are not drawn to scale, which are not intended to limit the scope of the present disclosure. In practical operations, each element in the drawings has specific dimensions such as a length, a width, and a depth.

FIG. 1 is a schematic structural view of a conventional twin-stage exposure device. Referring to FIG. 1, the twin-stage exposure device includes: a first stage 101 and a second stage 102 for holding a substrate respectively; an alignment detection unit 103 for detecting alignment marks on the substrates; an optical projection unit 104 for exposing the substrates; and two measurement units (not shown) for measuring two dimensional coordinates of the first stage 101 and the second stage 102 respectively. The measurement units include optical interferometers. Each stage includes two sets of optical interferometers, and moveable reflectors of the optical interferometers are fixed on sidewalls of the two stages. As shown in FIG. 1, a first moveable reflector 107 and a second moveable reflector 108 are mounted on sidewalls of the first stage 101, and a third moveable reflector 109 and a fourth moveable reflector 110 are mounted on sidewalls of the second stage 102. The 45 degree deflector for z-axis detection (e.g., normal to a surface plane (x, y) of the stages) is omitted here for clarity.

While a first substrate 106 on the first stage 101 is exposed under the optical projection unit 104, alignment marks of a second substrate 105 are detected by the alignment detection unit 103 to align the second substrate 105. After the first substrate 106 on the first stage 101 is exposed under the optical projection unit 104, a third substrate is loaded on the first stage 101 to replace the first substrate 106. The first stage 101 is then moved to below the alignment detection unit 103, and alignment marks on the third substrate are aligned by the alignment detection unit 103. Meanwhile, the second stage 102 is moved to below the optical projection unit 104, and then the second substrate 105 is exposed under the optical projection unit 104.

However, it is found that the position calibration processes for the two measurement units on the two stages of above twin-stage exposure device depicted in FIG. 1 are complex, and interference (such as air turbulence caused by the motion of the two stages) among four optical interferometers may be generated to cause difficulties in accurately positioning the two stages. Production yields of the exposure device are thus adversely affected.

In one embodiment, an exposure device is provided including a stage, an optical projection unit, a first alignment detection unit, and a second alignment detection unit. The stage includes a first region and a related second region. The stage further includes a first clamp holder for holding a first substrate in the first region, and a second clamp holder for holding a second substrate in the second region. The optical projection unit is disposed above the stage and adapted for exposing the first substrate in the first region or the second substrate in the second region. The first alignment detection unit and the second alignment detection unit are symmetrically disposed on two opposite sides of the optical projection unit and are adapted for respectively detecting alignment marks on the substrates on the first clamp holder and the second clamp holder.

In one embodiment, the exposure device employs one stage and one measurement unit in which two sets of optical interferometers are involved (e.g., with one set of optical interferometers along x-axis direction and the other set along y-axis direction), or three optical interferometers are involved (e.g., with a first set along x-axis direction, a second set along y-axis direction, and a third set along z-axis direction). There is no need to employ two stages, two measurement units for the two stages, four optical interferometers (e.g., with two along x-axis and two along y-axis direction), or six optical interferometers (e.g., with two along x-axis direction, two along y-axis direction, and two along z-axis direction) as in conventional twin-stage exposure devices. The disclosed exposure device including, e.g., one stage and one measurement unit, avoids complex calibration and interferences among interferometers to facilitate more accurate positioning of the stage. Further, in one embodiment, the clamp holders are configured on the stage. When the first substrate on the first clamp holder is exposed by the optical projection unit, the alignment marks on the second substrate held by the second clamp holder is detected at the same time by the first or second alignment detection unit to align the second substrate. The steps of exposure and alignment may be performed alternatingly so that the production yield of the exposure device is improved.

FIGS. 2-6 are schematic structural views of an exemplary exposure device in accordance with various disclosed embodiments, and FIGS. 8-18 are schematic structural views showing intermediate structures in an exemplary exposure method according to various disclosed embodiments.

Figure 2:
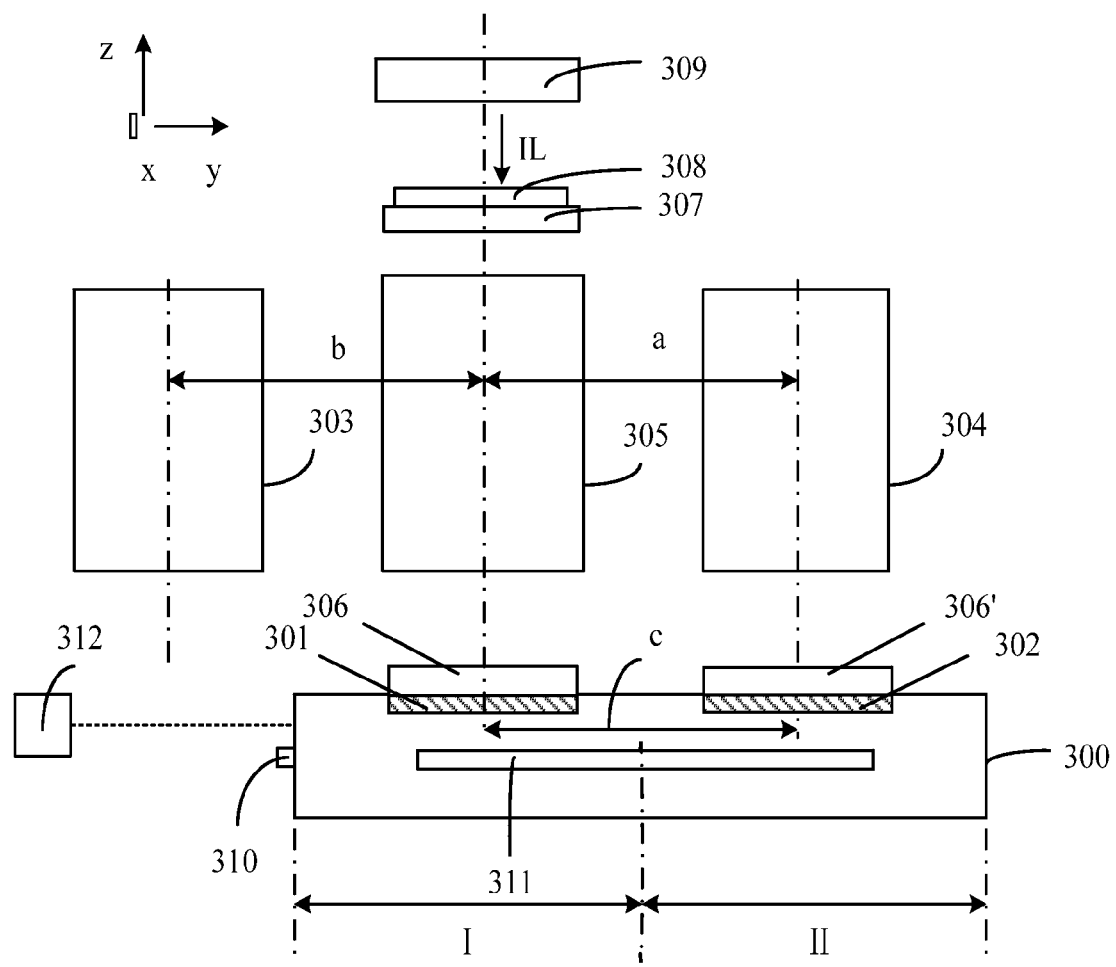
FIGS. 2-6 are schematic structural views of an exemplary exposure device in accordance with various disclosed embodiments.

Referring to FIG. 2, in an embodiment, the exposure device includes: an illumination unit 309 for illuminating a mask 308; a mask stage 307 for holding the mask 308; an optical projection unit 305 for projecting an imaging light beam through the mask 308 to a substrate 306; a first alignment detection unit 303 and a second alignment detection unit 304 which are symmetrically and separately disposed on opposite sides of the optical projection unit 305; a stage 300 for holding the substrate 306 and configured below the optical projection unit 305; and a main control unit (not shown) for controlling the exposure device and managing information of the alignment detection units, measurement unit, and/or other related units of the exposure device. In an example, the exposure device may be a step scanning or immersion exposure device.

In an embodiment, the illumination unit 309 includes a light source and an illuminating optical system. The light resource provides a rectangular or circular lighting region defined by a masking blade in the illumination unit 309 with an illuminating light (IL) to illuminate patterns formed on the mask with uniform illumination intensity. In one exemplary embodiment, the illuminating light (IL) may be a deep ultraviolet light such as a KrF excimer laser (wavelength: about 248 nm), an ArF excimer laser (wavelength: about 193 nm), or other suitable light source. In another exemplary embodiment, the illuminating light (IL) may be a vacuum ultraviolet light such as an F2 laser (wavelength: about 157 nm), an extreme ultraviolet light (wavelength: about 13.5 nm), or other suitable light source. In another exemplary embodiment, the illuminating light (IL) may be a glow (e.g., a g-line ray, an i-line ray, and so on) emitted from an ultra high pressure mercury lamp in ultraviolet light range.

The mask stage 307 fixes the mask 308 by a vacuum suction force and/or an electromagnetic attraction force. The mask stage 307 is coupled to a mask driver unit (not shown) which may drive the mask stage 307 slightly move along the x-axis direction, the y-axis direction, or a θz direction (i.e., a direction rotating around the z-axis) in an x-y plane which is perpendicular to an axis ax of the optical projection unit 305. In an exemplary embodiment, the mask stage 307 may include fine-tuning and/or rough-tuning mechanisms. The mask stage 307 may include, for example, a one-dimensional rough-tuning mechanism (e.g., driving along y-axis direction) and a fine-tuning mechanism (e.g., driving at least along three directions of x-axis, y-axis, and θz directions). The mask stage 307 further includes optical interferometers for measuring coordinates or positions of the mask.

The optical projection unit 305 projects the imaging light beams which transmit through the mask 308 to expose regions in a substrate in an imaging plane to transfer the patterns from the mask to the substrate. This accomplishes the exposure process to the substrate held by a first or second clamp holder.

In one embodiment, when the illuminating light (IL) is a KrF or ArF excimer laser, the optical projection unit 305 may be a refracting system including refracting optical components (e.g., lens). In another embodiment, when the illuminating light (IL) is an F2 laser, the optical projection unit 305 may be a catadioptric system including a refracting optical component combined with a reflecting optical component (such as convex lens and spectroscope); or a reflecting system including reflecting optical component(s); or a refracting system.

The stage 300 positioned below the optical projection unit 305 includes: a first region I and a second region II related to the first regions I. The first region I and the second region II may be adjacent to each other, or be spaced apart by a distance. The stage 300 further includes a first clamp holder 301 in the first region I and a second clamp holder 302 in the second region II. In an exemplary embodiment, a substrate may be fixed on the first clamp holder 301 or second clamp holder 302 by a vacuum suction force or an electromagnetic attraction force. In another exemplary embodiment, a substrate may be mechanically clamped on the first clamp holder 301 or the second clamp holder 302.

In one exemplary embodiment, the first clamp holder 301 and the second clamp holder 302 are positioned on the stage 300 along the y-axis direction. The stage 300 has a width along the y-axis direction greater than a width along the x-axis direction, so as to decrease the size of the stage 300 and to decrease the space occupied by the stage 300.

In one exemplary embodiment, the stage 300 may have a width along the y-axis direction substantially equal to a width along the x-direction of the stage 300.

The stage 300 is coupled to a first driver unit (not shown), which drives the stage 300 to move along the x-axis, y-axis, z-axis, or θz directions. In various embodiments, the exposure device includes one stage, which is easier for operation compared with conventional twin-stage exposure devices. In addition, the one stage uses the first driver unit, which improves stability of the exposure device and reduces production cost.

The exposure device further includes a measuring unit (not shown) for measuring position of the stage 300. The measuring unit includes optical interferometers (not shown), and/or encoder readers. The optical interferometers are optical instruments for measuring displacements by measuring optical path length differences based on a multi-beam interference principle. Specifically, a light beam coming from a light source of each optical interferometer is divided into two light beams by a beam splitter. The two light beams are respectively reflected by a fixed reflecting mirror and a moveable reflecting mirror and then recombine in light path to create interference fringes. When the moveable reflecting mirror moves, the optical path length difference between a light beam reflected by the fixed reflecting mirror and a light beam reflected by the moveable reflecting mirror varies and a light intensity of the interference fringe in the spectroscope also varies. The variation of the light intensity of the interference fringe is converted to electrical pluses by a photoelectric conversion unit and electronic circuits in a receiver of the optical interferometer. After adjustment and amplification, the electrical pluses are input into a reversible counter. Then the reversible counter may count a pulse number of the electrical pluses so that a displacement of the movable reflecting lens may be calculated by an electronic calculator. In an exemplary embodiment, the optical interferometers may include a first optical interferometer (e.g., along the x-axis direction) and a second optical interferometer (e.g., along the y-axis direction). The first optical interferometer is adapted for measuring a displacement of the stage along the x-axis direction. A first movable reflecting mirror of the first optical interferometer is configured on a side wall of the stage 300 along a first direction (e.g., the x-axis direction). The second optical interferometer is adapted for measuring a displacement of the stage along a second direction (e.g., the y-axis direction) which is orthogonal to the first direction. A second movable reflecting mirror of the second optical interferometer is configured on another side wall of the stage 300 along the second direction (e.g., the y-axis direction). The optical interferometers may include a third optical interferometer (e.g., an optical interferometer along the z-axis direction), which is adapted for measuring a displacement of the stage along a third direction which is perpendicular to the first direction (the x-axis direction) and the second direction (the y-axis direction). A moveable reflecting mirror of the third optical interferometer (not shown) is configured on a top surface of the stage.

The first and second optical interferometers measure the stage's displacements along the x- and y-axis directions to position the stage in the x-y plane. In various embodiments, the exposure device includes a single stage, and a single measurement unit, in which two optical interferometers (e.g., one along the x-axis direction and the other along the y-axis direction), or three optical interferometers (e.g., one along the x-axis direction, one along the y-axis direction, and one along the z-axis direction) are involved.

The first alignment detection unit 303 and the second alignment detection unit 304 are respectively and/or symmetrically positioned along the y-axis direction, e.g., on a −y side and a +y side of the optical projection unit 305. The first alignment detection unit 303 is adapted for detecting alignment marks of the first substrate 306 on the first clamp holder 301 and for detecting a first reference mark on the first region I of the stage 300. And the second alignment detection unit 304 is adapted for detecting alignment marks of a second substrate 306' on the second clamp holder 302 and for detecting a second reference mark on the second region II.

A distance b between a central axis of the first alignment detection unit 303 and a central axis of the optical projection unit 305 is substantially equal to a distance a between a central axis of the second alignment detection unit 304 and the central axis of the optical projection unit 305. The distances a and b are not limited in accordance with various embodiments. In one embodiment, the distances a and b are substantially equal to a distance c between a center of the first clamp holder and a center of the second clamp holder.

In an embodiment, the first alignment detection unit 303 further includes a first leveling unit (not shown). The first leveling unit is fixed on a sidewall of the first alignment detection unit 303 and adapted for measuring a height of a first substrate on the first clamp holder 301, while the first alignment detection unit 303 performs alignment to the substrate.

In an embodiment, the second alignment detection unit 304 further includes a second leveling unit (not shown). The second leveling unit is fixed on a sidewall of the second alignment detection unit 304 and adapted for measuring a height of a second substrate on the second clamp holder 302, while the second alignment detection unit 304 performs alignment to the substrate.

In an embodiment, the first alignment detection unit 303 and the second alignment detection unit 304 respectively further include a first optical imaging system and a second optical imaging system (not shown). The first optical imaging system automatically focuses according to the height of the first substrate on the first clamp holder 301. The second optical imaging system automatically focuses according to the height of the second substrate on the second clamp holder 302.

In an exemplary embodiment, the first alignment detection unit 303 and the second alignment detection unit 304 may employ image alignment sensors, which are used in processing images, including such as field image alignment (FIA) sensors, or diffraction based detection systems. By doing this, each of the first and second alignment detection units includes: a light source (such as a halogen lamp), a fixed reference mark, an optical imaging system, an image sensor (such as a charge coupled device (CCD)), etc. A broadband light provided by the light source of the first or second alignment detection unit illuminates a mark to be detected (e.g., the alignment marks). A light reflected by the mark is received by the image sensor (for example, CCD) through the optical imaging system, so that images of the mark and the reference mark are imaged in an imaging plane of the image sensor, i.e. CCD. Then, by processing the images obtained by the CCD, a coordinate of the mark in a coordinate system may be obtained using the reference mark as an origin (or a base point).

In an exemplary embodiment, the first reference mark or the second reference mark is used as a reference mark, and the first reference mark or the second reference mark is fixed on the stage 300. A main control unit (not shown) is adapted for obtaining coordinates of alignment marks of the first substrate on the first clamp holder 301 using the first reference mark as a reference mark. Likewise, the main control unit (not shown) is adapted for obtaining coordinates of alignment marks of the second substrate on the second clamp holder 301 using the second reference mark as a reference mark.

Figure 3:
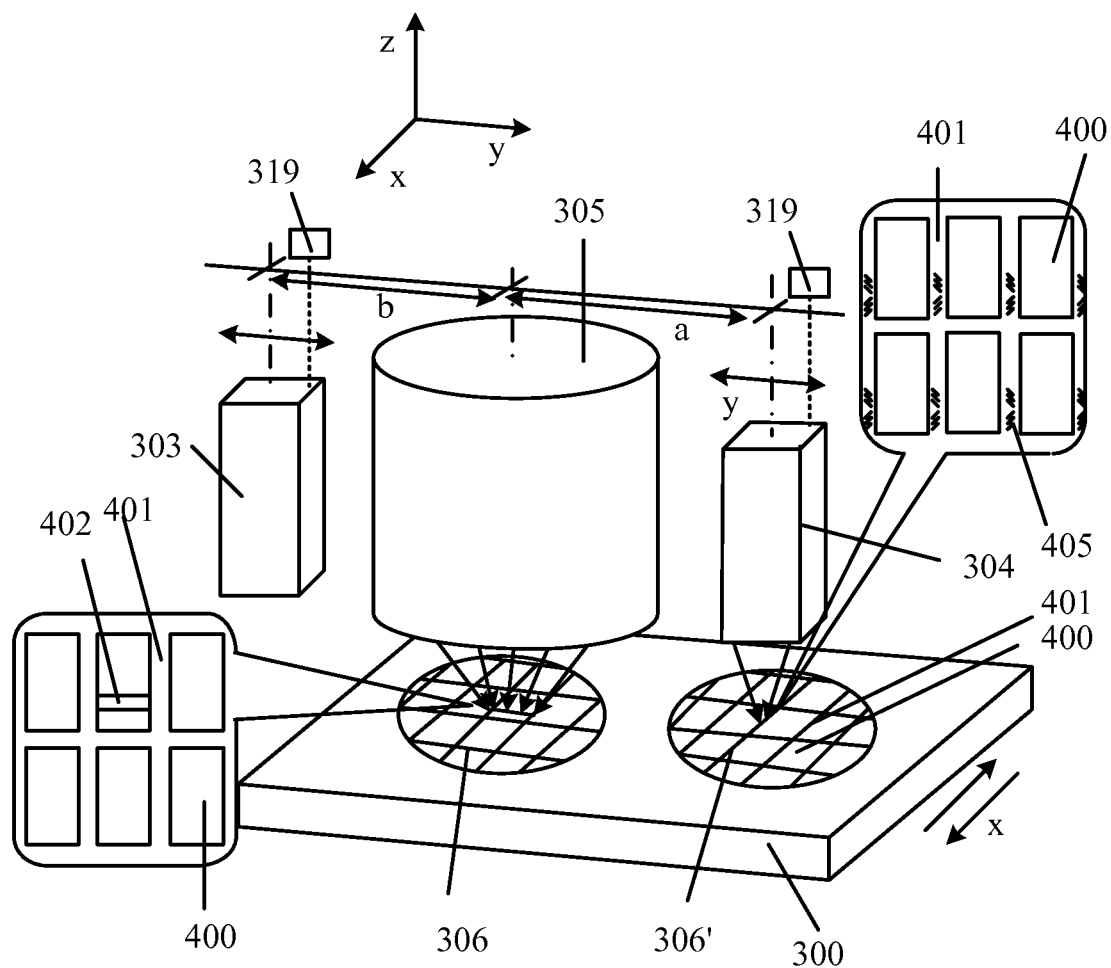

The exposure device further includes a second driver unit 319. FIG. 3 is a schematic three-dimensional structural view of an exposure device in accordance with various disclosed embodiments. Referring to FIG. 3, the first alignment detection unit 303 and second alignment detection unit 304 are coupled to the second driver unit 319. The second driver unit 319 may drive the first alignment detection unit 303 and second alignment detection unit 304 to slightly move along the first direction (e.g., the x-axis direction) and the second direction (e.g., the y-axis direction) in the x-y plane perpendicular to the central axis of the optical projection unit 305. In other words, the second driver unit 319 may drive the first alignment detection unit 303 and the second alignment detection unit 304 to move close to or far away from the optical projection unit 305.

Referring to FIG. 3, in an example, while using the first direction (e.g., the x-axis direction) as a scanning direction of the exposure device, the second driver unit 319 drives the first alignment detection unit 303 and the second alignment detection unit 304 to move along the second direction (e.g., the y-axis direction). When an exposure region 400 of a first substrate (for example, the substrate 306 in the FIG. 3) held by a first clamp holder on the stage 300 is exposed by the optical projection unit 305 (e.g., while using the x-axis direction as the scanning direction, a short side of an exposure slit 402 of the optical projection unit 305 overlaps a long side of the exposure region 400 along the non-scanning direction, e.g., the y-axis direction), the first alignment detection unit 303 or the second alignment detection unit 304 is aligned to a scribe line 401 and an alignment mark 405 in the scribe line 401 on the second substrate held by the second clamp holder (for example, the substrate 306' in the FIG. 3).

Figure 4:
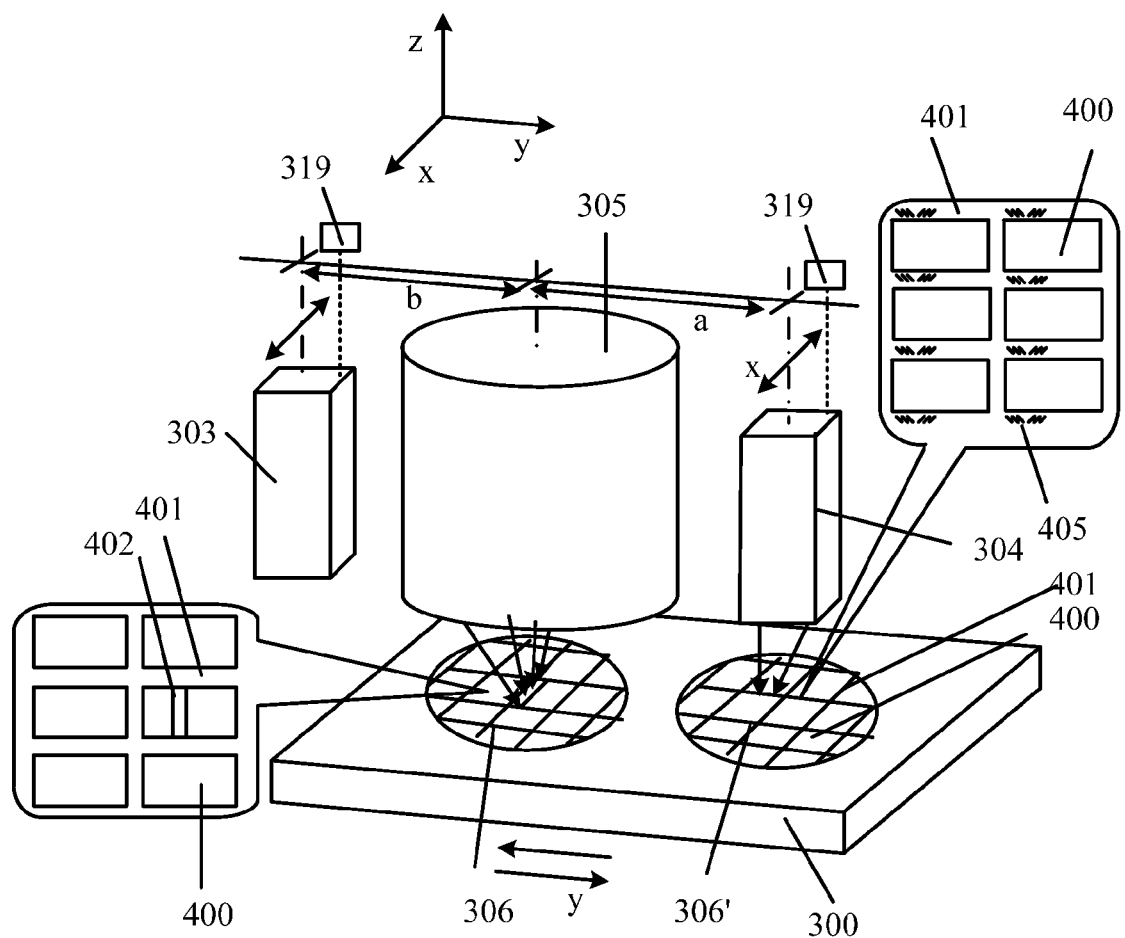

Referring to FIG. 4, in another example, while using the second direction (e.g., the y-axis direction) as a scanning direction of the exposure device, the second driver unit 319 drives the first alignment detection unit 303 and the second alignment detection unit 304 to move along the first direction (e.g., the x-axis direction). When an exposure region 400 of a substrate (for example, the substrate 306 in the FIG. 3) held by any one clamp holder on the stage 300 is exposed by the optical projection unit 305 (e.g., while using the y-axis direction as the scanning direction, a short side of an exposure slit 402 of the optical projection unit 305 overlaps a long side of the exposure region 400 along the non-scanning direction, e.g., the x-axis direction), the first alignment detection unit 303 or the second alignment detection unit 304 is aligned to a scribe line 401 and an alignment mark 405 in the scribe line 401 on the second substrate held by the second clamp holder (for example, the substrate 306' in the FIG. 3). Because the width of the stage 300 along the y-axis direction is greater than the width of the stage 300 along the x-axis direction, stability of the exposure process can be improved by using the y-axis direction as the scanning direction.

In various embodiments, the exposure device includes two alignment detection units (e.g., the first alignment detection unit 303 and the second alignment detection unit 304). When the first substrate on the first clamp holder 301 is exposed by the optical projection unit 305, the second alignment detection unit 304 detects the alignment marks of the second substrate. When the exposure of the first substrate is completed, a third substrate is loaded on the first clamp holder to replace the first substrate and the stage 300 is moved to position the second clamp holder 302 below the optical projection unit 305. When the second substrate held by the second clamp holder 302 is exposed by the optical projection unit 305, the first alignment detection unit 303 detects alignment marks of the third substrate. The above steps are performed repeatedly so that when a substrate held by a clamp holder is exposed by the optical projection unit 305, alignment marks of another substrate held by the other clamp holder can be detected by the first alignment detection unit 303 or the second alignment detection unit 304. In this manner, the production yield of the exposure device is improved.

Figure 5:
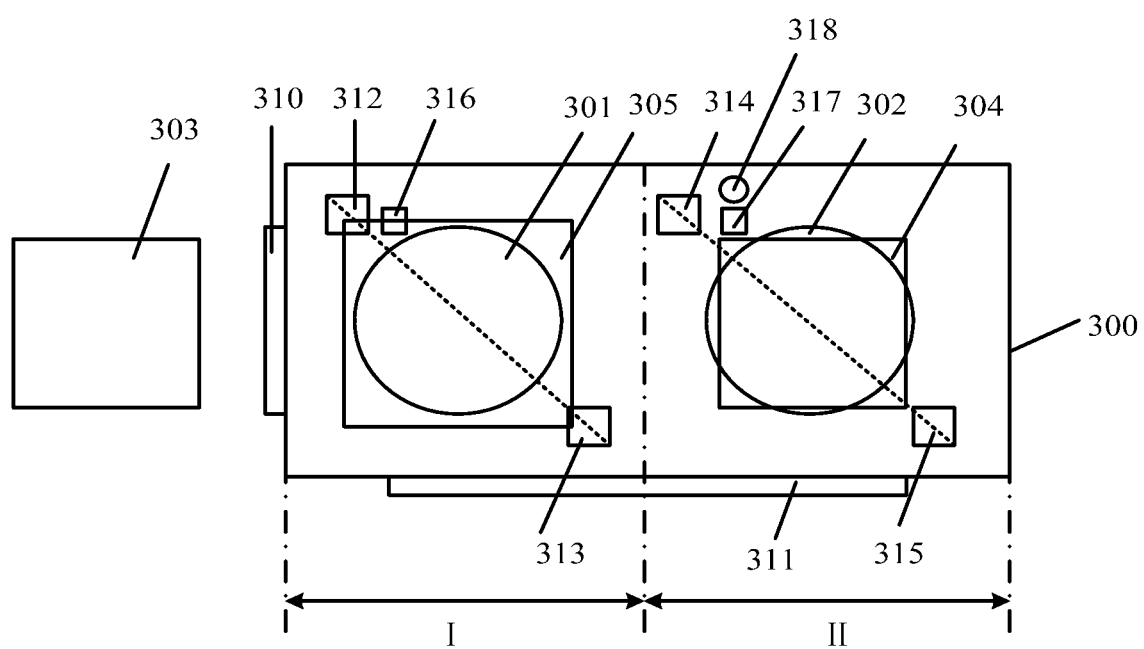

FIG. 5 is a schematic structural top view of the exemplary exposure device in FIG. 3. Referring to FIG. 5, the first reference mark is in the first region I of the stage 300 and is used as a reference mark to calculate positions in coordinates of alignment marks on a substrate held by the first clamp holder 301 in subsequent exposure processes.

The first reference mark includes a first sub-reference mark 312 and a second sub-reference mark 313 which are on a diagonal line of the first region I. A distance between the first (or the second) sub-reference mark and the center of the first clamp holder is greater than a radius of a substrate (e.g., a wafer substrate). By calculations based on position information of the first sub-reference mark 312 and the second sub-reference mark 313, the main control unit may obtain: displacements of the stage 300 along the x- and y-axis directions, a horizontal rotation coefficient of the stage 300 in the first region I, and expansion coefficients of the stage 300 along the x- and y-axis directions in the first region I.

In some embodiments, a connection line between a center of the first sub-reference mark 312 and a center of the second sub-reference mark 313 passes through the center of the first clamp holder 301. This ensures convenience on calculating coordinates of the alignment marks on the substrate held by the first clamp holder 301, when using the first sub-reference mark 312 and the second sub-reference mark 313 as the reference marks.

In other embodiments, the connection line between the center of the first sub-reference mark 312 and the center of the second sub-reference mark 313 may not pass through the center of the first clamp holder 301.

The second reference mark is in the second region II of the stage 300 and is used as a reference mark to calculate positions in coordinates of alignment marks on a substrate held by the second clamp holder 302 by the second alignment detection unit 304 in subsequent exposure processes.

The second reference mark includes a third sub-reference mark 314 and a fourth sub-reference mark 315 which are on a diagonal line of the second region II. A connection line between a center of the third sub-reference mark 314 and a center of the-fourth sub-reference mark 315 is parallel to the connection line between a center of the first sub-reference mark 312 and a center of the second sub-reference mark 313. A distance between the third (or the fourth) sub-reference mark and the center of the second clamp holder 302 is greater than a radius of a substrate.

The main control unit obtains the displacements of the stage 300 along the x- and y-axis directions, a horizontal rotation coefficient of the stage 300, and expansion coefficients of the stage 300 along the x- and y-axis directions in the second region II, when using the third sub-reference mark 314 and the fourth sub-reference mark 315 as reference marks.

In some embodiments, a connection line between the center of the third sub-reference mark 314 and the center of the fourth sub-reference mark 315 passes through a center of the second clamp holder 302. This ensures convenience on calculating coordinates of alignment marks of a substrate held by the second clamp holder 302, when using the third sub-reference mark 314 and the fourth sub-reference mark 315 as the reference marks.

In other embodiments, the connection line between the center of the third sub-reference mark 314 and the center of the fourth sub-reference mark 315 may not pass through the center of the second clamp holder 302.

In various embodiments, the connection line between the center of the first sub-reference mark 312 and the center of the second sub-reference mark 313 is at least partially parallel or substantially parallel to the connection line between the center of the third sub-reference mark 314 and the center of the fourth sub-reference mark 315. This can improve efficiency of the subsequent exposure and aligning processes. During production mode, either the check of the pair (312, 313) and the pair (314, 315) can be omitted for maximum productivity when the system reaches stable condition.

Figure 6:
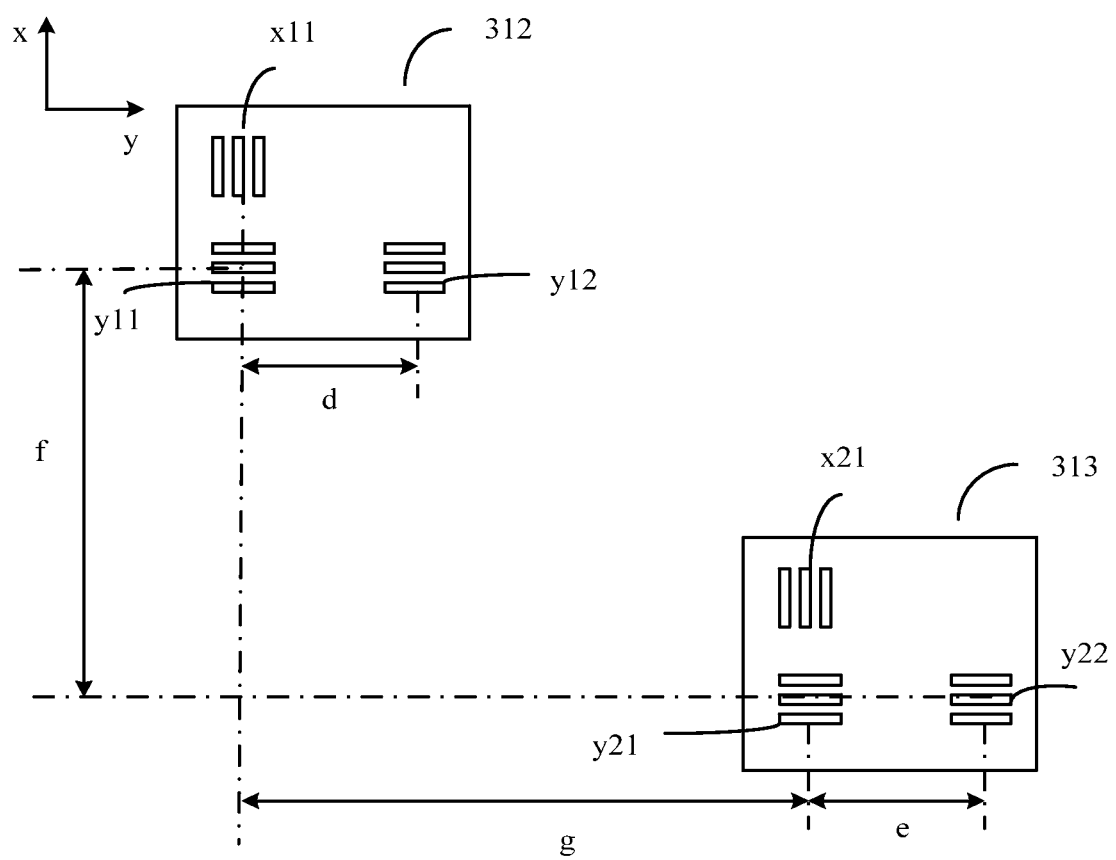

FIG. 6 is a schematic structural view of the first sub-reference mark 312 and the second sub-reference mark 313. Referring to FIG. 6, in an embodiment, both the first sub-reference mark 312 and the second sub-reference mark 313 include at least two marks in the y-axis direction and at least one mark in the x-axis direction. For example, the first sub-reference mark 312 includes: a mark y11 and a mark y12 in the y-axis direction, and a mark x11 in the x-axis direction; the second sub-reference mark 313 includes: a mark y21 and a mark y22 in the y-axis direction, and a mark x21 in the x-axis direction. It should be noted that, values of the marks x11 and x21 about position information of the stage are acquired by the first optical interferometer (e.g., the optical interferometer in the x-axis direction), and values of the marks y11, y12, y21 and y22 about position information of the stage are acquired by the second optical interferometer (e.g., the optical interferometer in the y-axis direction).

The displacement of the stage 300 in the first region I along the x-axis direction is equal to about 0.5 times of a sum of the values of the marks x11 and x21.

The displacement of the stage 300 in the first region I along the y-axis direction is equal to about 0.5 times of a sum of the values of the marks y11 and y21.

The horizontal rotation coefficient of the stage 300 in the first region I is: ((the value of the mark y12–the value of the mark y11)/d, (the value of the mark y22–the value of the mark y21)/e). The parameter d is a distance between a center of the mark y11 and a center of the mark y12 along the y-axis direction, and the parameter e is a distance between a center of the mark y21 and a center of the mark y22 along the y-axis direction.

The expansion coefficient of the stage 300 in the first region I along the x-axis direction is equal to: (the value of the mark x21–the value of the mark x11–g)/g. The parameter g is a distance between a center of the mark x21 and a center of the mark x11 along the x-axis direction.

The expansion coefficient of the stage 300 in the first region I along the y-axis direction is equal to: (the value of the mark y21–the value of the mark y11–f)/f. The parameter f is a distance between the center of the mark y21 and the center of the mark y11 along the y-axis direction.

Referring to FIG. 5, the stage 300 further includes a first mask alignment sensor 316 in the first region I, which is adapted for detecting an alignment mark of a mask. In an embodiment, the first mask alignment sensor 316 is configured adjacent to the first sub-reference mark 312, and a distance between the first mask alignment sensor 316 and the center of the first clamp holder 301 is greater than a radius of a substrate. In other embodiments, the first mask alignment sensor 316 may be located in other suitable positions in the first region I.

The stage 300 further includes a second mask alignment sensor 317 in the second region II, which is adapted for detecting the alignment mark of the mask. In an embodiment, the second mask alignment sensor 317 is configured adjacent to the third sub-reference mark 314, and a distance between the second mask alignment sensor 317 and the center of the second clamp holder 302 is greater than a radius of a substrate. In other embodiments, the second mask alignment sensor 317 may be located in other suitable positions in the second region II.

A light energy sensor 318 is adapted for measuring light energy of the optical projection unit 305 and is configured adjacent to a border between the first region I and the second region II. In an embodiment, the light energy sensor 318 may be positioned close to the third sub-reference mark 314 and located in the first region I or the second region II. In other embodiments, the light energy sensor 318 may be in other suitable positions in the first region I or the second region II. A distance between the light energy sensor 318 and the center of the first or second clamp holder is greater than a radius of a substrate.

In an embodiment, the exposure device further includes an air cushion unit (not shown) or a magnetic unit (not shown)

located under the stage 300 for raising the stage. This can reduce external disturbances and resistances when the stage is moving.

In an embodiment, the exposure device further includes a substrate loading unit (not shown), which is adapted to load/unload a substrate onto/from the first or second clamp holder.

Figure 7:
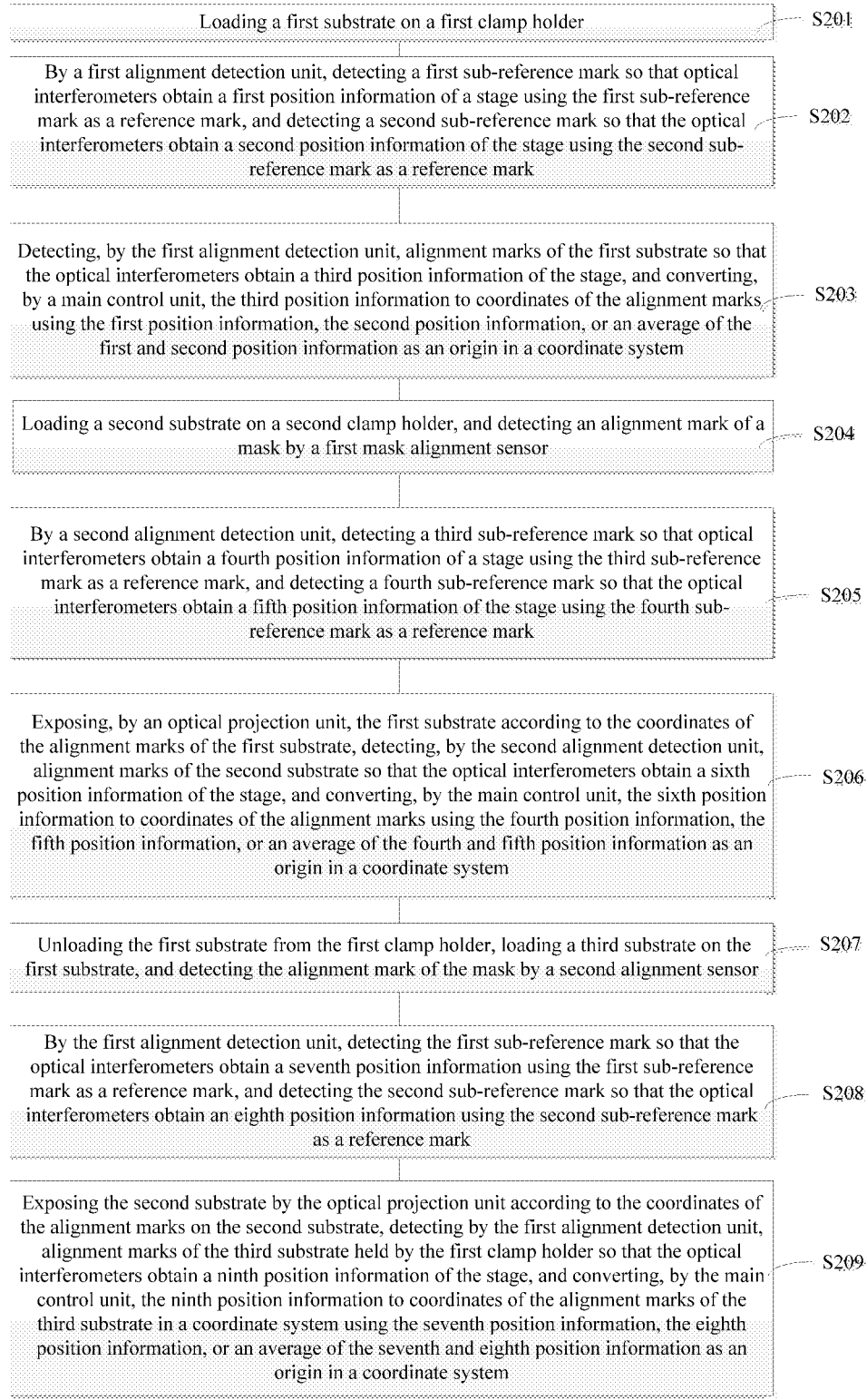
FIG. 7 is a flow chart illustrating an exemplary exposure method in accordance with various disclosed embodiments.

In another embodiment, an exposure method by using the above described exposure device is provided. FIG. 7 is a flow chart of an exemplary exposure method in accordance with various embodiments. In Step S201, a first substrate is loaded on a first clamp holder.

In Step S202, a first sub-reference mark is detected by a first alignment detection unit so that optical interferometers obtain a first position information of a stage using the first sub-reference mark as a reference mark. A second sub-reference mark is detected by the first alignment detection unit so that the optical interferometers obtain a second position information of the stage using the second sub-reference mark as a reference mark.

In Step S203, alignment marks of the first substrate are detected by the first alignment detection unit so that the optical interferometers obtain a third position information of the stage. The third position information is converted by a main control unit to coordinates of the alignment marks using the first position information, the second position information, or an average of the first and second position information as an origin in a coordinate system. Leveling is performed shortly before the alignment detection and feeds back measured height data so that the alignment can pre-focus before the alignment detection. A leveling sensor (not shown) is configured along the scanning direction and attached to each side of the alignment units 303 or 304. The design can facilitate alignment detection in both opposite directions along the scanning axis.

In Step S204, a second substrate is loaded on a second clamp holder, and an alignment mark of a mask is detected by a first mask alignment sensor.

In Step S205, a third sub-reference mark is detected by a second alignment detection unit so that optical interferometers obtain a fourth position information of a stage using the third sub-reference mark as a reference mark. A fourth sub-reference mark is detected by the second alignment detection unit so that the optical interferometers obtain a fifth position information of the stage using the fourth sub-reference mark as a reference mark.

In Step S206, the first substrate held by the first clamp holder is exposed by an optical projection unit according to the coordinates of the alignment marks of the first substrate. Alignment marks of the second substrate held by the second clamp holder are detected by the second alignment detection unit so that the optical interferometers obtain a sixth position information of the stage, and converting, by a main control unit, the sixth position information to coordinates of the alignment marks using the fourth position information, the fifth position information, or an average of the fourth and fifth position information as an origin. The detected positions of the second substrate are processed to eliminate influence from positioning the first substrate during exposure. That is, position offsets (such as translation, rotation, magnification, orthogonality, etc) in the second substrate caused by the alignment adjustment of the first substrate during exposure are calculated and subtracted out, when calculating the aligned position of the second substrate.

In Step S207, the first substrate is unloaded from the first clamp holder and replaced by loading a third substrate on the first substrate. The alignment mark of the mask is detected by a second alignment sensor.

In Step S208, the first sub-reference mark is detected by the first alignment detection unit so that the optical interferometers obtain a seventh position information using the first sub-reference mark as a reference mark. The second sub-reference mark is detected by the first alignment detection unit so that the optical interferometers obtain an eighth position information using the second sub-reference mark as a reference mark.

In Step S209, the second substrate held by the second clamp holder is exposed by the optical projection unit according to the coordinates of the alignment marks on the second substrate. Alignment marks of the third substrate held by the first clamp holder are detected by the first alignment detection unit so that the optical interferometers obtain a ninth position information of the stage. The ninth position information is converted by the main control unit to coordinates of the alignment marks of the third substrate in a coordinate system using the seventh position information, the eighth position information, or an average of the seventh and eighth position information as an origin in the coordinate system. The detected positions of the third substrate are processed to eliminate influence from positioning the second substrate during exposure. That is, position offsets (such as translation, rotation, magnification, orthogonality, etc) in the third substrate caused by the alignment adjustment of the second substrate during exposure are calculated and subtracted out, when calculating the aligned position of the third substrate.

FIGS. 8-18 are schematic views of intermediate structures for illustrating an exemplary exposure method (e.g., as depicted in FIG. 7) in accordance with various disclosed embodiments.

Figure 8:
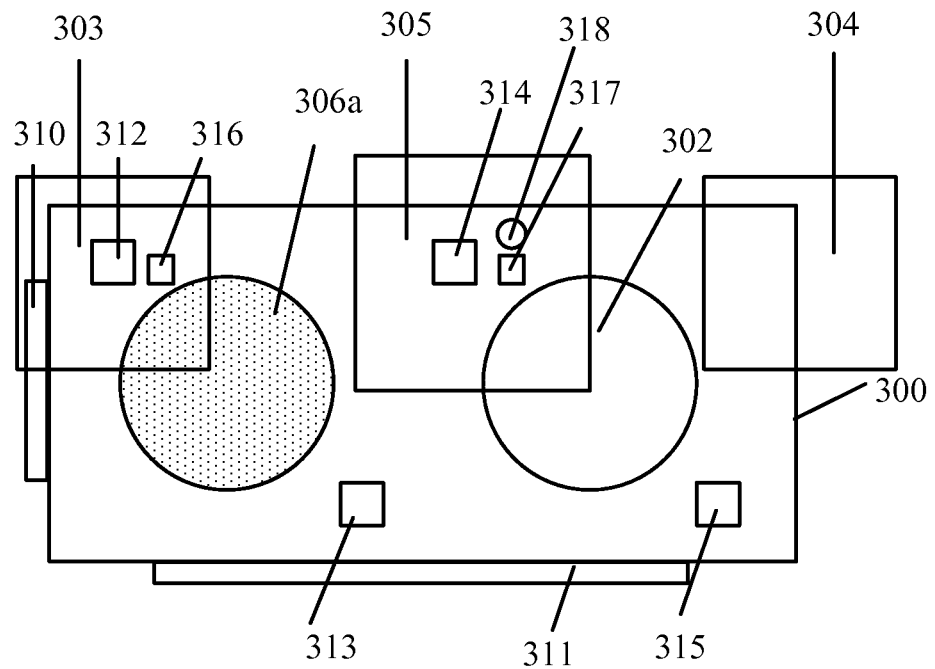
FIGS. 8-18 are schematic views of intermediate structures according to an exemplary exposure method in accordance with various disclosed embodiments.

Referring to FIG. 8, a first substrate 306a is loaded on a first clamp holder by a substrate loading unit (not shown). The substrate loading unit is adapted to load or unload a substrate on the first clamp holder 301 or a second clamp holder 302.

After loading the first substrate 306a, a first alignment detection unit 303 detects a first sub-reference mark 312 so that optical interferometers may obtain a first position information of a stage 300 using the first sub-reference mark 312 as a reference mark. The first position information includes a displacement of the stage 300 along an x-axis direction measured by a first optical interferometer and a displacement of the stage 300 along a y-axis direction measured by a second optical interferometer while using the first sub-reference mark 312 as a reference mark.

While the first alignment detection unit 302 detecting the first sub-reference mark 312, a light energy detection sensor 318 measures a light energy of an optical projection unit 305 to determine whether the light energy of the optical projection unit 305 is stable or not. In an embodiment, the light energy of the optical projection unit 305 may be measured before each substrate is exposed, after a certain number of substrates are exposed, or at regular intervals.

Before loading the first substrate 306a on the first clamp holder, the exposure method further includes: loading an exposure program to the exposure device; and, according to sizes and widths of exposure regions on substrates which are predetermined in the exposure program, moving the first alignment detection unit 303 and a second alignment detection unit 304 for a certain distance along a direction which is orthogonal to a scanning direction of the exposure device. In this manner, while the optical projection unit 305 is aligned to an exposure region of a substrate held by a clamp holder, the first alignment detection unit 303 or the second alignment detection unit 304 is aligned to a scribe line 401 and an alignment mark 405 in the scribe line 401 of another substrate held by another clamp holder.

Figure 9:
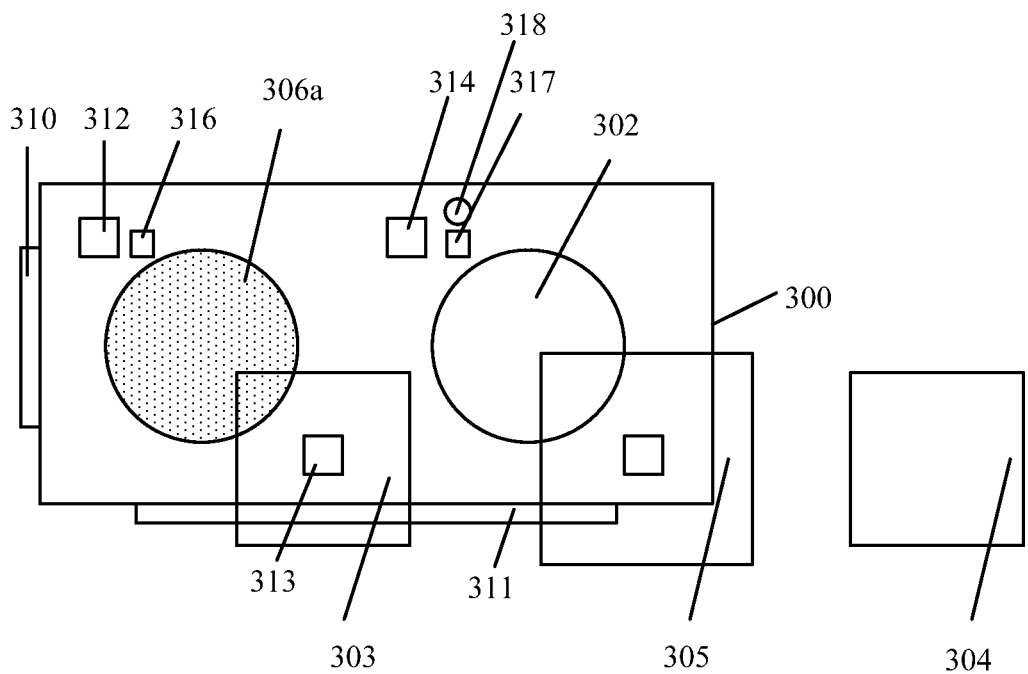

Referring to FIG. 9, the stage 300 is moved such that a second sub-reference mark 313 is below the first alignment detection unit 303. The first alignment detection unit 303 detects the second sub-reference mark 313 so that the optical interferometers may obtain a second position information of the stage using the second sub-reference mark 313 as a reference mark. The second position information includes a displacement of the stage 300 along the x-axis direction measured by the first optical interferometer and a displacement of the stage 300 along the y-axis direction measured by the second optical interferometer while using the second sub-reference mark 313 as a reference mark. Meanwhile, when the first sub-reference mark 312 and the second sub-reference mark 313 are used as reference marks, a main control unit (not shown) obtains: displacements of the stage 300 along the x- and y-axis directions, a horizontal rotation coefficient of the stage 300, and expansion coefficients of the stage 300 along the x- and y-axis directions in the first region I.

Figure 10:
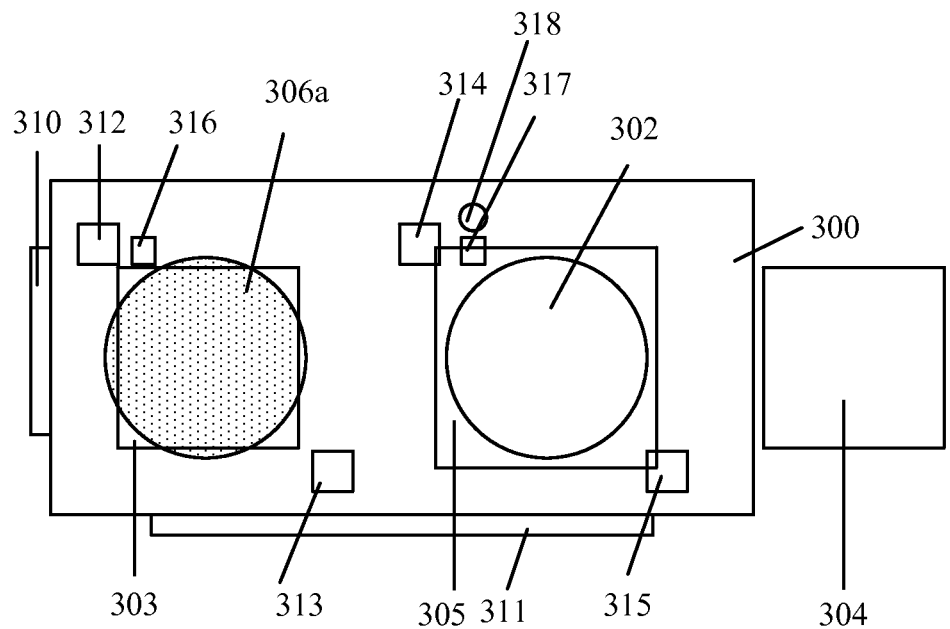

Referring to FIG. 10, the stage 300 is moved such that the first substrate 306a is below the first alignment detection unit 303. The first alignment detection unit 303 detects an alignment mark of the first substrate 306a so that the optical interferometers obtain a third position information of the stage. In order to manage position information of exposure regions on the substrate 306a and accomplish the aligning process of the first substrate 306a, the main control unit (not shown) converts the third position information to a coordinate of the alignment mark of the first substrate in a coordinate system using the first position information, the second position information, or an average of the first and second position information as an origin in the coordinate system.

Before detecting the alignment mark of the first substrate 306a by the first alignment detection unit 303, the exposure method further includes: measuring a height of the first substrate 306a by a first leveling unit of the first alignment detection unit 303; and performing an automatic focus according to the height of the first substrate 306a by a first optical imaging system of the first alignment detection unit 303. The height of the first substrate 306a is generally measured earlier than the automatic focus by about 10 milliseconds to about 100 milliseconds. After the automatic focus, the alignment mark of the first substrate 306a is detected.

Figure 11:
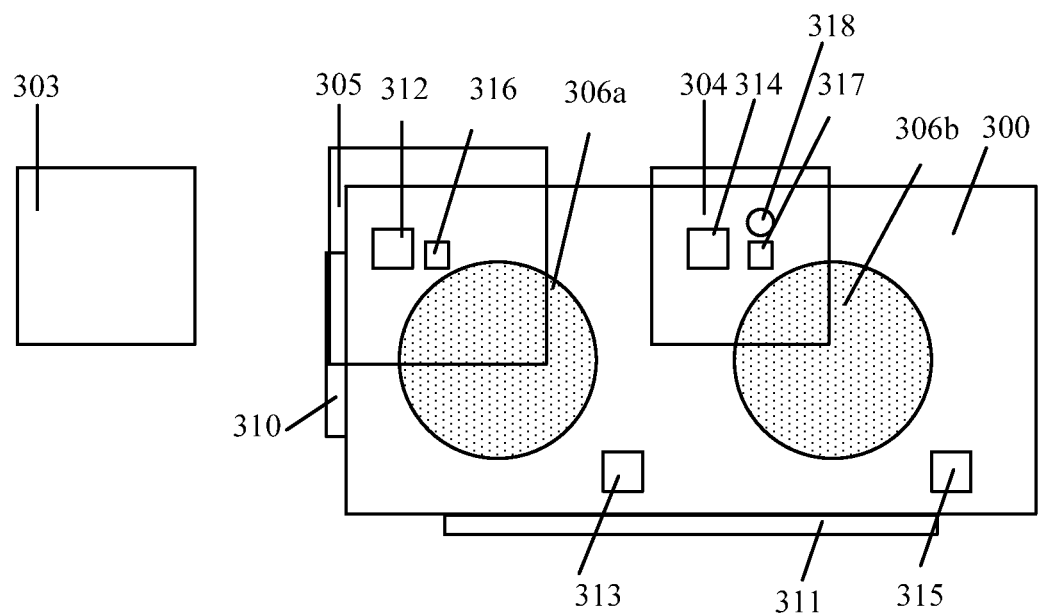

Referring to FIG. 11, a second substrate 306b is loaded on the second clamp holder 302, and an alignment mark of a mask is detected by a first mask alignment sensor 316, so as to obtain: displacements along the x- and y-axis directions, a horizontal rotation coefficient, and expansion coefficients along the x- and y-axis directions of the mask. The method for obtaining the above values of the mask is the same as that of calculating associated values of the stage 300 in the region I.

Specifically, when an aligning process is performed on the mask, an image of the alignment mark of the mask is formed in the first mask alignment sensor 316 through the first optical imaging system of the optical projection unit 305, so that the coordinate of the alignment marks of the mask is obtained. Because a position relationship between the first mask alignment sensor 316 and the first sub-reference mark 312 and/or the second sub-reference mark 313 is predetermined, a position relationship between the mask and the stage 300 in the first region I may be determined. In addition, errors of coordinates of the alignment marks on the substrate and the mask may be compensated by the parameters about the stage or the mask stage (e.g., rotation parameters, moving parameters, and scanning rates of the stage or the mask stage); by adjustment of magnification of lenses; and by compensating magnification biases, so that an accuracy alignment between the stage and substrates can be achieved.

In various embodiments, the aligning process of the mask may be performed only once for all substrates in a batch.

Figure 12:
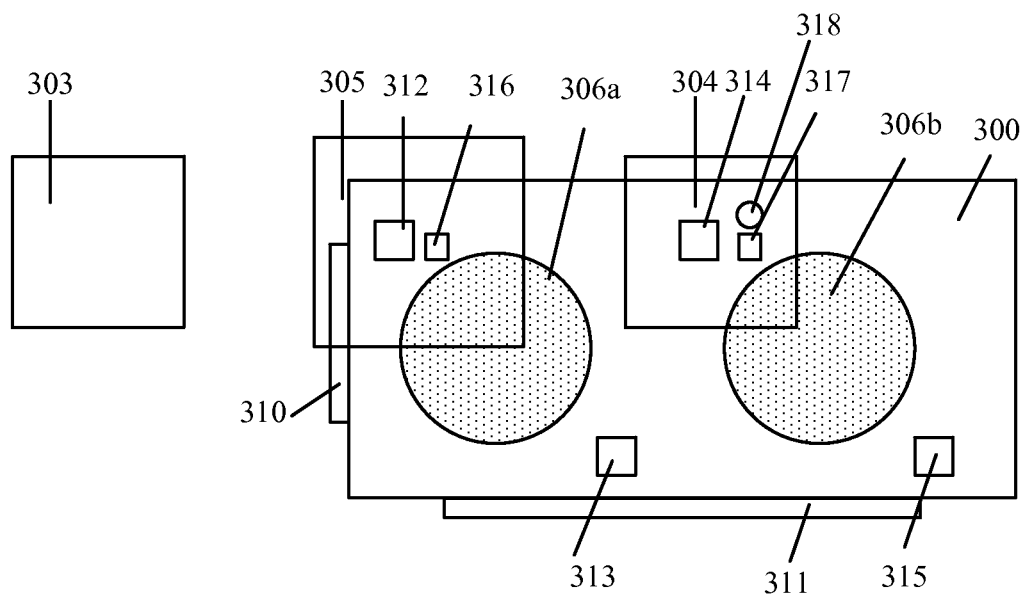

Referring to FIG. 12, the stage 300 is moved so that a second alignment detection unit 304 detects a third sub-reference mark 314 for the optical interferometers to obtain a fourth position information using the third sub-reference mark 314 as a reference mark. The third position information includes a displacement of the stage 300 along the x-axis direction measured by the first optical interferometer and a displacement of the stage 300 along the y-axis direction measured by the second optical interferometer while using the third sub-reference mark 314 as a reference mark.

Figure 13:
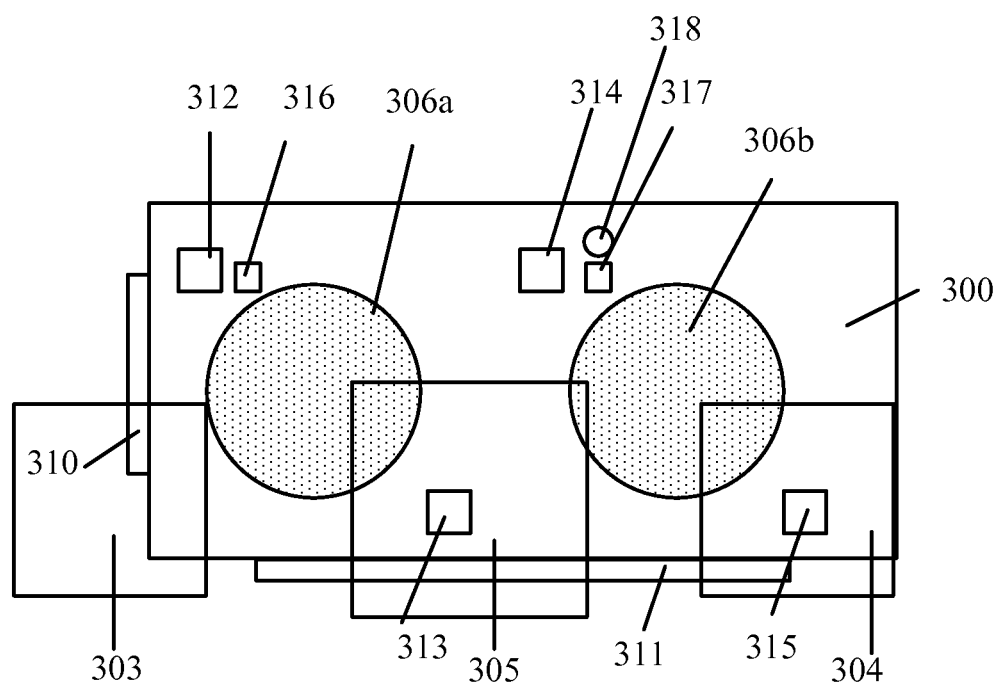

Referring to FIG. 13, the stage 300 is moved such that a fourth sub-reference mark 315 is below the second alignment detection unit 304. The second alignment detection unit 304 detects the fourth sub-reference mark 315 to obtain a fifth position information of the stage using the fourth sub-reference mark 315 as a reference mark. The fifth position information includes a displacement of the stage 300 along the x-axis direction measured by the first optical interferometer and a displacement of the stage 300 along the y-axis direction measured by the second optical interferometer using the fourth sub-reference mark 315 as a reference mark. Meanwhile, the main control unit (not shown) obtains: displacements of the stage 300 along the x- and y-axis directions, a horizontal rotation coefficient of the stage 300, and expansion coefficients of the stage 300 along the x- and y-axis directions in the second region II using the third sub-reference mark 314 and the fourth sub-reference mark 315 as reference marks.

Figure 14:
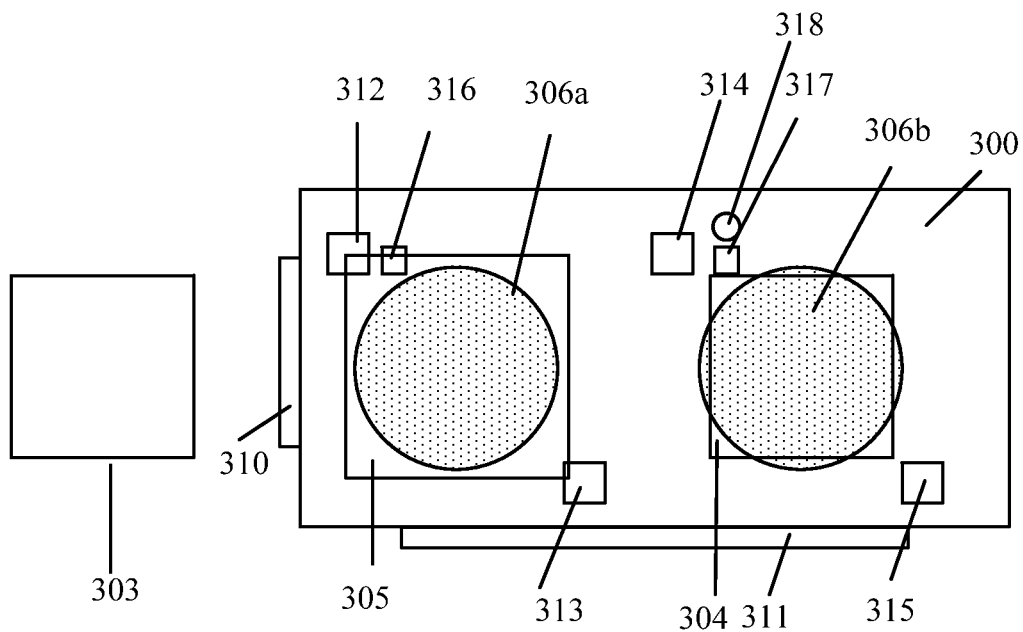

Referring to FIG. 14, the stage 300 is moved such that the first substrate 306a is below the optical projection unit 305. The optical projection unit 305 exposes the first substrate 306a according to coordinates of the alignment mark of the first substrate 306a. Meanwhile, the second alignment detection unit 304 detects an alignment mark of the second substrate 306b held by the second clamp holder so that the optical interferometers may obtain a sixth position information of the stage. The sixth position information includes a displacement of the stage 300 along the x-axis direction measured by the first optical interferometer and a displacement of the stage 300 along the y-axis direction measured by the second optical interferometer. The main control unit (not shown) converts the sixth position information to a coordinate of the alignment mark of the second substrate in a coordinate system using the fourth position information, the fifth position information, or an average of the fourth and fifth position information as an origin in the coordinate system. This manages position information of exposure regions on the second substrate 306b and completes the aligning process of the second substrate 306b. The detected positions of the second substrate 306b are processed to eliminate influence from positioning the first substrate 306a during exposure. That is, position offsets (such as translation, rotation, magnification, orthogonality, etc) of the second substrate caused by the alignment adjustment of the first substrate 306a during the exposure are calculated and subtracted out, when calculating the aligned position of the second substrate 306b.

Before detecting the alignment mark of the second substrate 306b by the second alignment detection unit 304, the disclosed exposure method further includes: measuring a height of the second substrate 306b by a second leveling unit of the second alignment detection unit 304; and performing an automatic focus according to the height of the second substrate 306b by a second optical imaging system of the second alignment detection unit 304. The height of the second substrate 306b is generally measured earlier than the automatic focus of the second optical imaging system, e.g., by about 10 milliseconds to about 100 milliseconds. After the automatic focus, the alignment mark of the second substrate 306b is detected.

Figure 15:
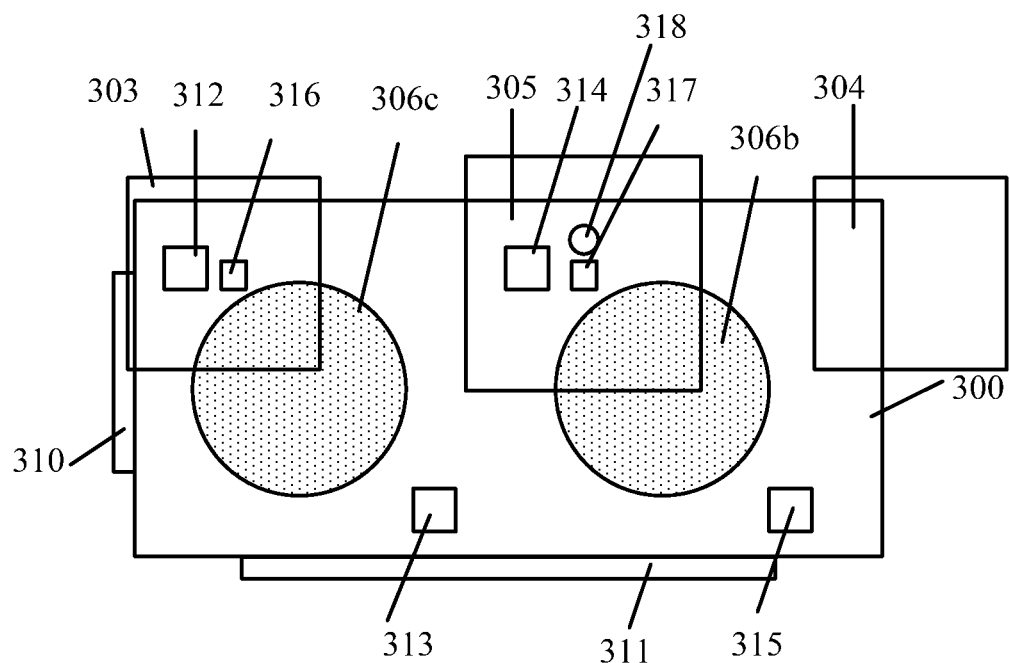

Referring to FIG. 15, after the first substrate 306a held by the first clamp holder is exposed, the first substrate 306a is unloaded from the first clamp holder and a third substrate 306c is loaded on the first clamp holder. Meanwhile, a second mask alignment sensor detects the alignment mark of the mask. In various embodiments, the aligning process of the mask is performed only once for all substrates in a batch.

Figure 16:
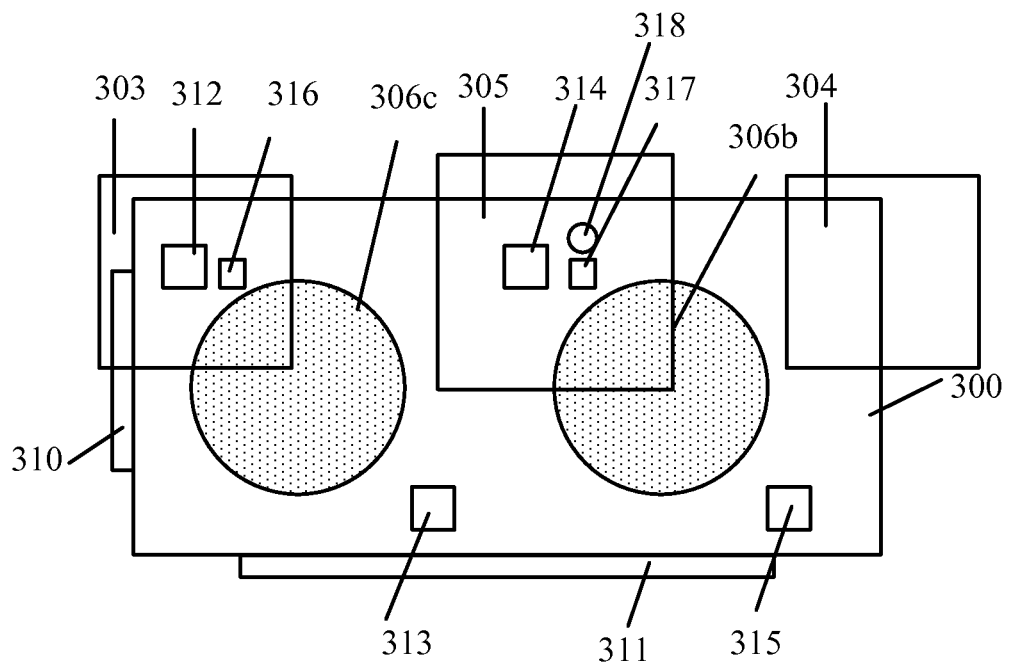
Figure 17:
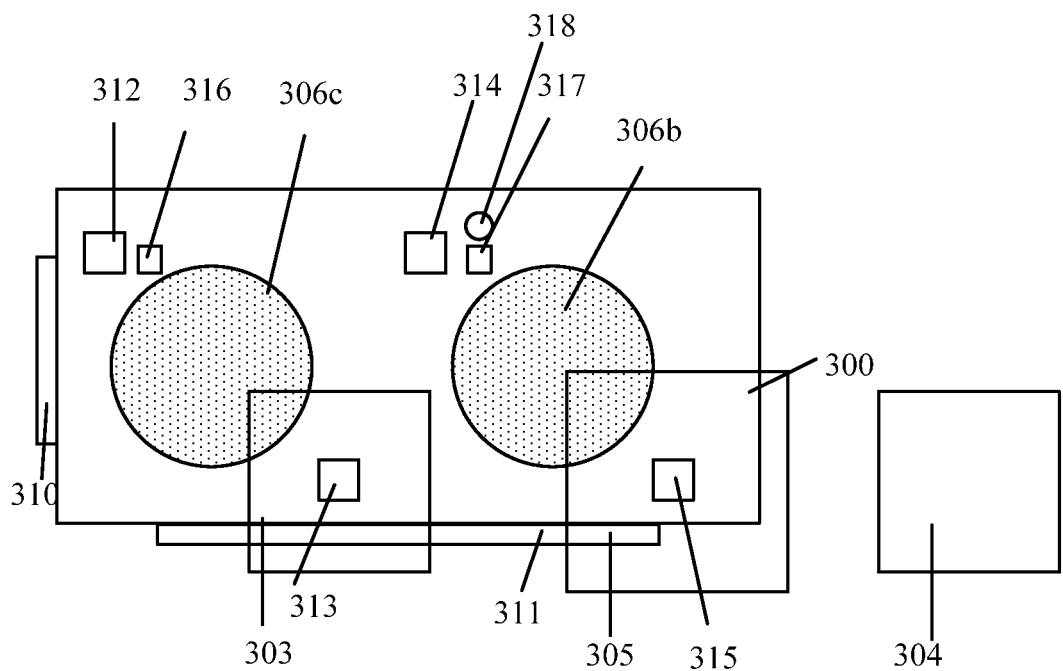

Referring to FIGS. 16 and 17, the first alignment detection unit 303 detects the first sub-reference mark 312 so that the optical interferometers may obtain a seventh position information of the stage using the first sub-reference mark 312 as a reference mark. The first alignment detection unit 303 detects the second sub-reference mark 313 so that the optical interferometers may obtain an eighth position information of the stage using the second sub-reference mark 313 as a reference mark. The main control unit (not shown) obtains: displacements of the stage 300 along the x- and y-axis directions, a horizontal rotation coefficient of the stage 300, and expansion coefficients of the stage 300 along the x- and y-axis directions in the first region I, while using the first sub-reference mark 312 and the second sub-reference mark 313 as reference marks.

Figure 18:
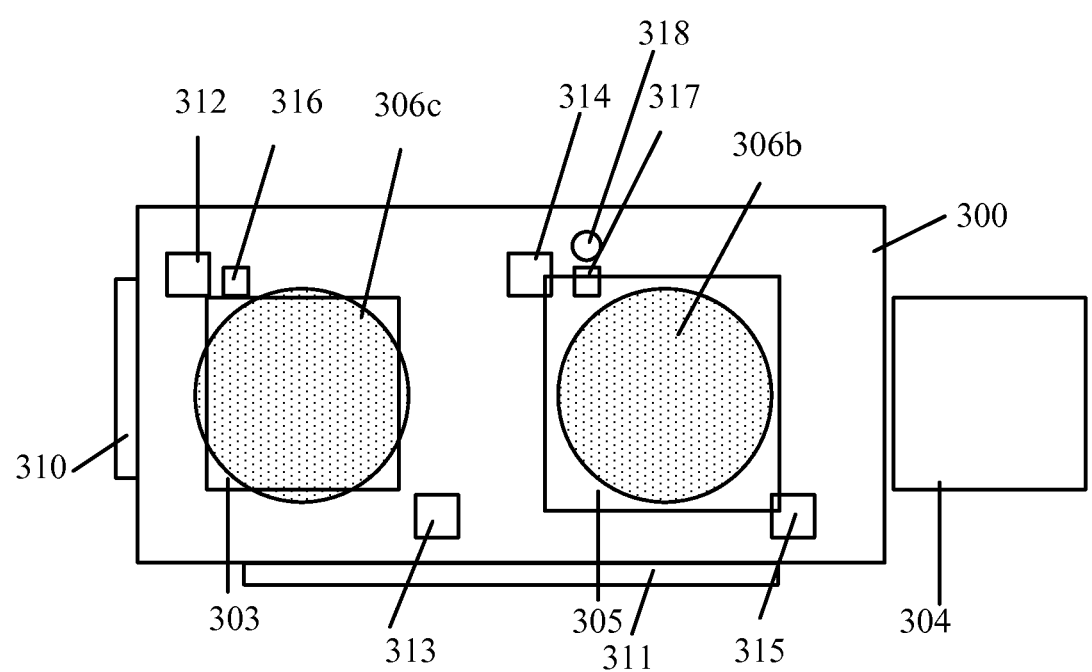

In Step S209 of FIG. 7 and referring to FIG. 18, the second substrate 306b is exposed by the optical projection unit 305 according to the coordinates of the alignment mark of the second substrate 306b. Meanwhile, the first alignment detection unit 303 detects the third substrate 306c so that the optical interferometers may obtain a ninth position information. The main control unit (not shown) converts the ninth position information to a coordinate of the alignment mark of the third substrate in a coordinate system using the seventh position information, the eighth position information, or an average of the seventh and eighth position information as an origin in the coordinate system. This manages position information of exposure regions on the third substrate 306c and completes the aligning process of the third substrate 306c. The detected positions of the third substrate 306c are processed to eliminate influence from positioning the second substrate 306b during exposure. That is, position offsets (such as translation, rotation, magnification, orthogonality, etc) of the third substrate 306c caused by the alignment adjustment of the second substrate 306b during the exposure are calculated and subtracted out, when calculating the aligned position of the third substrate 306c.

Before detecting the alignment mark of the third substrate 306c by the first alignment detection unit 303, the disclosed exposure method further includes: measuring a height of the third substrate 306c by the first leveling unit of the first alignment detection unit 303; and performing an automatic focus according to the height of the third substrate 306c by the first optical imaging system of the first alignment detection unit 303. The height of the third substrate 306c is generally measured earlier than the automatic focus of the third optical imaging system, e.g., by about 10 milliseconds to about 100 milliseconds. After the automatic focus, the alignment mark of the third substrate 306c is detected.

After the above-described processes, the exposed second substrate 306b is unloaded off the second clamp holder, and a fourth substrate is loaded on the second clamp holder. This is followed by the above-disclosed process, e.g., as depicted in FIGS. 2-18. And the exposure process can be repeated as desired, so that, when a substrate in a clamp holder is exposed by the optical projection unit 305, an alignment mark of another substrate is detected by the first or second alignment detection unit for alignment of the other substrate. Such processes can be performed alternatingly so that the production yield of the exposure device is improved.

In this manner, clamp holders are configured on the stage. When a first substrate in a first clamp holder is exposed by an optical projection unit, the alignment mark of a second substrate is detected by a first or second alignment detection unit to align the second substrate. This improves production yield of the exposure device.

Further, the exposure device employs one stage and one measurement unit in which two optical interferometers (e.g., with one along x-axis direction and the other along y-axis direction), or three optical interferometers (e.g., with one along x-axis direction, one along y-axis direction, and one along z-axis direction) are involved. There is no need to employ two stages, two measurement units for the two stages, four optical interferometers (e.g., with two along x-axis direction and two along y-axis direction), or six optical interferometers (e.g., with two along x-axis direction, two along y-axis direction, and two along z-axis direction) as in conventional twin-stage exposure devices. The disclosed exposure device including, e.g., one stage and one measurement unit, avoids complex calibration and interferences among the interferometers. The stage can be more accurately positioned.

In addition, when the first substrate held by the first clamp holder is exposed by the optical projection unit, the second alignment detection unit detects an alignment mark of the second substrate held by the second clamp holder. When the second substrate held by the second clamp holder is exposed by the optical projection unit, the first alignment detection unit detects an alignment mark of the third substrate held by the first clamp holder. This can improve production yield of the exposure device.

The embodiments disclosed herein are exemplary only. Other applications, advantages, alternations, modifications, or equivalents to the disclosed embodiments are obvious to those skilled in the art and are intended to be included within the scope of the present disclosure.

What is claimed is:

1. An exposure device, comprising:
a stage comprising a first region and a second region related to the first region, a first clamp holder located in the first region and adapted for holding a first substrate, and a second clamp holder located in the second region and adapted for holding a second substrate;
an optical projection unit, located above the stage and adapted for exposure of the first substrate in the first region or the second substrate in the second region;
a first alignment detection unit, adapted for detecting alignment marks of the first substrate; and
a second alignment detection unit, adapted for detecting alignment marks of the second substrate, wherein the first alignment detection unit and the second alignment detection unit are symmetrically positioned on opposite sides of the optical projection unit,
wherein a non-zero distance between a center of the first clamp holder and a center of the second clamp holder is equal to a distance between a central axis of the first alignment detection unit and a central axis of the optical projection unit, or equal to a distance between a central axis of the second alignment detection unit and the central axis of the optical projection unit.

2. The exposure device according to claim 1, wherein the first region comprises a first reference mark detected by the first alignment detection unit for calculating coordinates of alignment marks on the first substrate.

3. The exposure device according to claim 2, wherein the first reference mark comprises a first sub-reference mark and a second sub-reference mark positioned diagonally in the first region.

4. The exposure device according to claim 3, wherein a connection line between a center of the first sub-reference mark and a center of the second sub-reference mark passes through a center of the first clamp holder.

5. The exposure device according to claim 1, wherein the second region comprises a second reference mark detected by the second alignment detection unit for calculating coordinates of alignment marks on the second substrate.

6. The exposure device according to claim 5, wherein the second reference mark comprises a third sub-reference mark and a fourth sub-reference mark positioned diagonally in the second region.

7. The exposure device according to claim 6, wherein a connection line between a center of the third sub-reference mark and a center of the fourth sub-reference mark passes through a center of the second clamp holder.

8. The exposure device according to claim 1, wherein the first alignment detection unit further comprises a first leveling unit adapted for measuring a height of the first substrate and the second alignment detection unit further comprises a second leveling unit adapted for measuring a height of the second substrate.

9. The exposure device according to claim 1, wherein each of the first and second alignment detection units further comprises a first optical imaging system and a second optical imaging system, the first optical imaging system performs an automatic focus according to the height of the first substrate, and the second optical imaging system performs an automatic focus according to the height of the second substrate.

10. The exposure device according to claim 1, further comprising a measuring unit adapted for measuring position of the stage, the measuring unit comprising optical interferometers having reflectors located on surfaces of the stage.

11. The exposure device according to claim 10, wherein the optical interferometers comprise:
a first optical interferometer having a moveable reflector located on a side wall of the stage along a first direction and adapted for measuring displacements of the stage along the first direction;
a second optical interferometer having a reflector located on a side wall of the stage along a second direction and adapted for measuring displacements of the stage along the second direction; and
a third optical interferometer having a reflector located on a side wall of the stage along a third direction and adapted for measuring displacements of the stage along the third direction.

12. The exposure device according to claim 1, further comprising a main control unit, adapted for obtaining coordinates of alignment marks on the first substrate using a first reference mark as a reference mark and for obtaining coordinates of alignment marks on the second substrate using a second reference mark as a reference mark.

13. An exposure method, comprising:
providing an exposure device, the exposure device comprising:
a stage comprising a first region and a second region related to the first region, a first clamp holder located in the first region and adapted for holding a first substrate, and a second clamp holder located in the second region and adapted for holding a second substrate;
an optical projection unit, located above the stage and adapted for exposure of the first substrate in the first region or the second substrate in the second region;
a first alignment detection unit, adapted for detecting alignment marks of the first substrate; and
a second alignment detection unit, adapted for detecting alignment marks of the second substrate, wherein the first alignment detection unit and the second alignment detection unit are symmetrically positioned on opposite sides of the optical projection unit,
wherein a non-zero distance between a center of the first clamp holder and a center of the second clamp holder is equal to a distance between a central axis of the first alignment detection unit and a central axis of the optical projection unit, or equal to a distance between a central axis of the second alignment detection unit and the central axis of the optical projection unit;
exposing, by the optical projection unit, the first substrate held by the first clamp holder and detecting, by the second alignment detection unit, the alignment marks of the second substrate on the second clamp holder; and
exposing, by the optical projection unit, the second substrate held by the second clamp holder and detecting, by the first alignment detection unit, alignment marks of a third substrate on the first clamp holder.

14. The exposure method according to claim 13, wherein, before exposing the first substrate on the first clamp holder by the optical projection unit, the exposure method further comprises:
loading the first substrate on the first clamp holder;
detecting, by the first alignment detection unit, a first sub-reference mark so that optical interferometers obtain a first position information of the stage using the first sub-reference mark as a reference mark;
detecting, by the first alignment detection unit, a second sub-reference mark so that the optical interferometers obtain a second position information of the stage using the second sub-reference mark as a reference mark;
detecting, by the first alignment detection unit, alignment marks of the first substrate so that the optical interferometers obtain a third position information of the stage;
converting, by a main control unit, the third position information to coordinates of the alignment marks in the first substrate in a coordinate system using the first position information, the second position information, or an average of the first and second position information as an origin in the coordinate system;
loading the second substrate on the second clamp holder and aligning a mask to a first alignment sensor for detecting an alignment mark of the mask;
detecting, by the second alignment detection unit, a third sub-reference mark so that the optical interferometers obtain a fourth position information using the third sub-reference mark as a reference mark; and
detecting, by the second alignment detection unit, a fourth sub-reference mark so that the optical interferometers obtain a fifth position information using the fourth sub-reference mark as a reference mark.

15. The exposure method according to claim 14, further comprising:
measuring a height of the first substrate by a first leveling unit before detecting the alignment marks of the first substrate by the first alignment detection unit; and
performing an automatic focus by a first optical imaging system according to the height of the first substrate.

16. The exposure method according to claim 14, wherein detecting the alignment marks of the second substrate by the second alignment detection unit comprises:

detecting, by the second alignment detection unit, the alignment marks of the second substrate so that the optical interferometers obtain a sixth position information of the stage; and converting, by the main control unit, the sixth position information to coordinates of the alignment marks in the second substrate in a coordinate system using the fourth position information, the fifth position information, or an average of the fourth and fifth position information as an origin in the coordinate system.

17. The exposure method according to claim 16, further comprising:

measuring a height of the second substrate by a second leveling unit before detecting the alignment marks of the second substrate by the second alignment detection unit; and performing an automatic focus by the second optical imaging system according to the height of the second substrate.

18. The exposure method according to claim 13, wherein, before exposing the second substrate in the second clamp holder by a second optical projection unit, the method further comprises:

unloading the first substrate off the first clamp holder, loading the third substrate on the first clamp holder and aligning a mask to a second alignment sensor for detecting an alignment mark of the mask;

detecting, by the first alignment detection unit, a first sub-reference mark so that optical interferometers obtain a seventh position information of the stage using the first sub-reference mark as a reference mark; and detecting, by the first alignment detection unit, a second sub-reference mark so that the optical interferometers obtain an eighth position information of the stage using the second sub-reference mark as a reference mark.

\* \* \* \* \*